(12) United States Patent
Lach et al.

(10) Patent No.: US 6,603,141 B2
(45) Date of Patent: Aug. 5, 2003

(54) ORGANIC SEMICONDUCTOR AND METHOD

(75) Inventors: Lawrence E. Lach, Chicago, IL (US); Steven M. Scheifers, Hoffman Estates, IL (US); Jie Zhang, Buffalo Grove, IL (US); Daniel R. Gamota, Palatine, IL (US); Paul W. Brazis, Jr., South Elgin, IL (US)

(73) Assignee: Motorola, Inc., Schaumburg, IL (US)

( * ) Notice: Subject to any disclaimer, the term of this patent is extended or adjusted under 35 U.S.C. 154(b) by 18 days.

(21) Appl. No.: 10/034,337

(22) Filed: Dec. 28, 2001

(65) Prior Publication Data

US 2003/0122119 A1 Jul. 3, 2003

(51) Int. Cl.$^7$ ............................................... H01L 27/00
(52) U.S. Cl. ....................... 257/40; 257/27.117; 438/99
(58) Field of Search ....................... 257/40, 27.117 E; 438/99

(56) References Cited

U.S. PATENT DOCUMENTS

| | | | |
|---|---|---|---|
| 4,127,738 A | | 11/1978 | Ghosh et al. |
| 4,427,840 A | | 1/1984 | Waldrop et al. |
| 5,250,388 A | * | 10/1993 | Schoch et al. ............... 430/269 |
| 5,705,826 A | * | 1/1998 | Aratani et al. ................ 257/40 |
| 2001/0045798 A1 | * | 11/2001 | Christensen ................ 313/498 |
| 2002/0008464 A1 | * | 1/2002 | Christensen ................ 313/498 |
| 2002/0172887 A1 | * | 11/2002 | Wolk et al. ................. 430/200 |

OTHER PUBLICATIONS

Szczech et al., Fine–Line Conductor Manufactoring Using Drop–On–Demand PZT Printing Technology, IEEE Trans. Elec. Packaging Manufacturing, 25 (Jan. 2002) 26.*
Dimitrakopoulos and Mascaro, "Organic Thin–Film Transistors: A Review of Recent Advances," pp. 11–27 (Jan. 2001).
Gilles Horowitz, "Organic Field–Effect Transistors," Advanced Materials, pp. 365–377, (1998).
Kawase et al., "All–Polymer Thin Film Transistors Fabricated by High–Resolution Ink–jet Printing," IEEE, pp. 25.5.1–25.5.4 (2000).
Willander et al., "Polymer Based Devices Their Function and Characterization," pp. 4099–4104 (1993).

* cited by examiner

*Primary Examiner*—Richard Elms
*Assistant Examiner*—Christian D. Wilson

(57) ABSTRACT

A semiconductor device formed of a flexible or rigid substrate (10) having a gate electrode (11), a source electrode (12), and a drain electrode (13) formed thereon and organic semiconductor material (14) disposed at least partially thereover. With appropriate selection of material, the gate electrode (11) will form a Schottky junction and an ohmic contact will form between the organic semiconductor material (14) and each of the source electrode (12) and drain electrode (13). In many of the embodiments, any of the above elements can be formed through contact or non-contact printing. Sizing of the resultant device can be readily scaled to suit various needs.

25 Claims, 1 Drawing Sheet

ORGANIC SEMICONDUCTOR AND METHOD

TECHNICAL FIELD

This invention relates generally to semiconductors and more particularly to organic semiconductor materials.

BACKGROUND

Components (such as metal Schottky field effect transistors (MESFETs)) and circuits comprised of semiconductor materials are known in the art. Such technology has been highly successful. For some applications, however, traditional semiconductor processing over-performs and represents unneeded form factors and capabilities at a commensurate additional cost. In addition, traditional semiconductor processing often yields small parts that present handling difficulties during assembly and further require careful packaging. Traditional semiconductor processing also usually requires batch processing to achieve a reasonable cost per part because the fabrication facilities and equipment required are extremely expensive. Also, many semiconductor devices require a lengthy fabrication time and often require numerous chemicals, some of which are highly toxic and require special handling. These aspects of traditional semiconductor fabrication do not well support low data storage and data transmission rate applications and/or less expensive needs.

BRIEF DESCRIPTION OF THE DRAWINGS

The above needs are at least partially met through provision of the organic semiconductor device and method described in the following detailed description, particularly when studied in conjunction with the drawings, wherein.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

Generally speaking, pursuant to these various embodiments, a gate is formed on a substrate and organic semiconductor material is at least partially disposed thereover without an intervening dielectric such that a Schottky junction is thereby formed. Typically a source electrode and drain electrode will also be provided on the substrate in contact with the organic semiconductor material, wherein the source and drain electrodes are comprised of materials such that an ohmic contact results as between these two electrodes and the organic semiconductor material. So configured, a MESFET will result. The substrate can be flexible or rigid. Furthermore, any of the various elements described above can be formed through printing processes (including both contact and non-contact printing processes). As a result, extremely inexpensive devices can be made without a need for batch processing, large and complicated fabrication facilities, or many of the dangerous chemicals often associated with semiconductor processing.

Figure 1:
FIGS. 1–4 illustrate a first embodiment.

Referring now to FIG. 1, a first embodiment will be described. An initial substrate 10 can be comprised of a variety of materials, including flexible and substantially rigid materials. In general, the substrate 10 itself should be an insulator. Various plastics, including thin flexible sheets such as polyester, generally work well for these purposes. Depending upon the application, however, other materials can work as well, including cloth and paper. The substrate 10 can be of various sizes as commensurate with the desired size of the final result.

Figure 2:
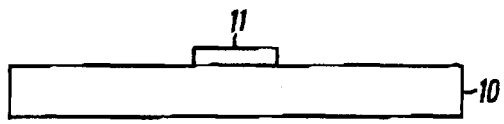
Figure 3:
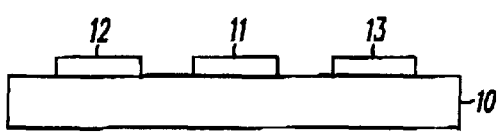

Referring to FIG. 2, a gate electrode 11 is formed on the substrate 10. The gate electrode 11 comprises a conductor formed of a material such as aluminum, magnesium, titanium, tantalum, manganese, calcium, or zinc that will form a Schottky junction with the organic semiconductor material applied later during the process. Referring to FIG. 3, a source electrode 12 and drain electrode 13 are then also formed on the substrate 10. The source electrode 12 and drain electrode 13 are formed of a material, such as copper, gold, silver, nickel, platinum, conductive polymer thick film, conductive polymer, carbon-based material, or tungsten that will result in an ohmic contact as between itself and the organic semiconductor material later applied.

Figure 4:
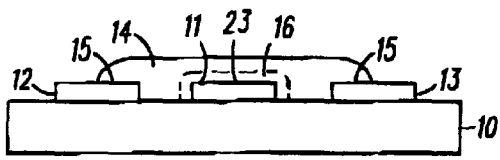

Referring now to FIG. 4, organic semiconductor material 14 is then applied to contact at least portions of the gate electrode 11, source electrode 12, and drain electrode 13 (just prior to this step it may be desirable to process the gate electrode 11 (either chemically or through some other process) to remove any oxide or other contaminant that may have formed thereon). So applied, the gate electrode 11 and organic semiconductor material 14 form a Schottky junction 23 while an ohmic contact 15 forms between the organic semiconductor material 14 and each of the source electrode 12 and drain electrode 13. Conductive paths to each electrode 11, 12, and 13 will ordinarily be provided to facilitate desired functionality. In the embodiment depicted, this is accomplished in part for the source electrode 12 and drain electrode 13 by leaving a portion each exposed. So configured, during use, a depletion region 16 will form proximal the gate electrode 11 in accordance with well understood prior art technique and a MESFET device achieved.

Any of the above elements (the electrodes 11, 12, and 13 and the organic semiconductor material 14) can be formed by use of one or more printing processes. For example, contact printing processes (including but not limited to stamping, screen printing, flexographic, and micro-contact printing) and non-contact printing processes (including but not limited to ink jet, electrostatic, laser transfer, and micro-dispensing) can be used to print the indicated materials as described. Depending upon the material form and carrier used, air drying and/or curing steps may be appropriate to ensure the desired adhesion and mechanical integrity.

A typical device will have an overall thickness of only a few microns (depending upon the specific materials, deposition process, and number of layers) and can have a footprint ranging from a few microns to one thousand or more microns. Notwithstanding such sizes, when formed upon a flexible substrate, the result device can maintain normal functionality even when flexed during use (of course, extreme bending of the substrate may, at some point, disrupt the continuity of one of more of the constituent elements of the device).

Figure 5:
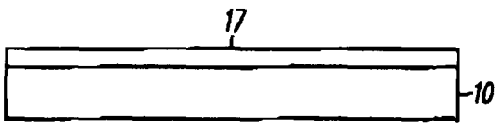
FIGS. 5–8 illustrate a second embodiment.
Figure 6:
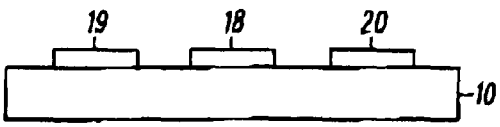
Figure 7:
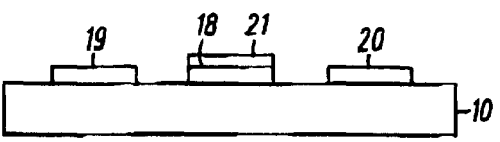
Figure 8:
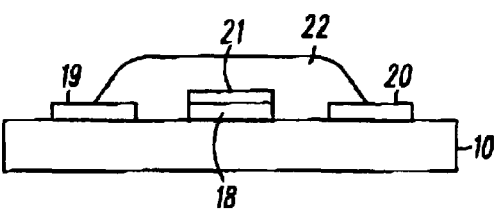

Referring to FIG. 5, in another embodiment, the substrate 10 can comprise a printed wiring board substrate (such as, for example, FR4). Such a substrate 10 includes a metallized surface 17. Using ordinary etching techniques, and referring now to FIG. 6, a gate electrode pad 18, a source electrode 19, and a drain electrode 20 can be formed. When the metallization layer 17 comprises copper, as it often does, the source electrode 19 and drain electrode 20 can be considered complete. Such a material, however, may not suffice to effect a Schottky junction for the gate electrode 18. In such a case, an appropriate material 21 for the gate electrode as mentioned above can be deposited upon the gate electrode pad 18 as illustrated in FIG. 7. Referring now to FIG. 8, organic semiconductor material 22 can then again be deposited as before to again yield a resultant MESFET. Again, as above, the supplemental gate material 21 and the organic semiconductor material 22 can be placed using printing techniques if desired.

Figure 9:
FIGS. 9–11 illustrate additional embodiments.
Figure 10:
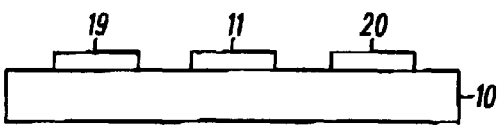

As an alternative approach to the embodiment just described, and referring to FIG. 9, when initially selectively etching the original metallization layer 17, instead of forming a source electrode 19, a drain electrode 20, and a gate electrode pad 18, only the source electrode 19 and drain electrode 20 need be formed. A gate electrode 11 of appropriate material can then be formed on the substrate 10 as shown in FIG. 10 and as described above. The process can then continue as described above.

As an alternative approach to the embodiment just described, when initially selectively etching the original metallization layer 17, instead of forming a source electrode 19, a drain electrode 20, and a gate electrode pad 18, only the gate electrode 11 need be formed such that the structure as depicted in FIG. 2 would again be exemplary. A source electrode 19 and drain electrode 20 of appropriate material can then be formed on the substrate 10 as shown in FIG. 10 and as described above. The process can then continue as described above.

Figure 11:
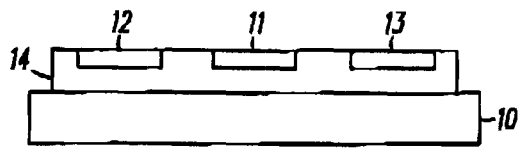

The embodiments described above present the various elements as being stacked in a particular order. That is, the semiconductor material 14 overlies the various electrodes 11, 12, and 13, which overly the substrate 10. Other orientations, however, are possible and acceptable. For example, with reference to FIG. 11, this layering can be reversed, such that the electrodes 11, 12, and 13 overlie the semiconductor material 14, which in turn overlies the substrate 10.

A wide variety of materials can be used consistently with the above processes and embodiments. Furthermore, a wide range of processing parameters can be varied, including device size and constituent element sizes, to suit a wide variety of application requirements. Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. A device comprising:
   a substrate;
   a first electrode disposed on the substrate;
   an organic semiconductor layer disposed over at least a portion of the first electrode such that there is no intervening dielectric between the first electrode and the organic semiconductor layer and wherein an interface between the first electrode and the organic semiconductor layer comprises a Schottky junction gate.

2. The device of claim 1 wherein the substrate comprises a flexible substrate.

3. The device of claim 1 wherein the substrate comprises a rigid substrate.

4. The device of claim 1 wherein at least one of the first electrode and the organic semiconductor layer are printed.

5. The device of claim 1 wherein the device comprises a MESFET.

6. The device of claim 1 and further comprising a second electrode and a third electrode disposed on the substrate and wherein the semiconductor layer is further disposed over at least a portion of the second electrode and the third electrode.

7. The device of claim 6 wherein the second electrode and the third electrode form an ohmic contact with the semiconductor layer.

8. The device of claim 1 wherein the first electrode is comprised of a first material and the second and third electrodes are formed of different material.

9. The device of claim 8 wherein the first material comprises one of aluminum, magnesium, titanium, tantalum, manganese, calcium, and zinc.

10. The device of claim 8 wherein the different material comprises at least one of copper, gold, silver, nickel, platinum, conductive polymer thick film, conductive polymers, carbon-based material, and tungsten.

11. A MESFET comprising:
    a substrate;
    an organic semiconductor layer;
    a gate printed on the substrate wherein the gate is at least partially in contact with the organic semiconductor layer and wherein the gate is comprised of a material having a work function selected such that an interface between the gate and the organic semiconductor layer comprises a Schottky junction;
    a drain printed on the substrate wherein the drain is at least partially in contact with the organic semiconductor layer and wherein the drain is comprised of material such that an interface between the drain and the organic semiconductor layer comprises an ohmic contact;
    a source printed on the substrate wherein the source is at least partially in contact with the organic semiconductor layer and wherein the source is comprised of material such that an interface between the source and the organic semiconductor layer comprises an ohmic contact.

12. The MESFET of claim 11 wherein the drain and source are comprised of substantially a same material.

13. The MESFET of claim 11 wherein the gate is comprised of one of aluminum, magnesium, titanium, tantalum, manganese, calcium, and zinc.

14. The MESFET of claim 11 wherein the second and third electrodes are comprised of at least one of copper, gold, silver, nickel, platinum, conductive polymer thick film, conductive polymer, carbon-based material, and tungsten.

15. The MESFET of claim 11 wherein the substrate comprises a flexible substrate.

16. A method of forming a MESFET comprising:
    providing a substrate;
    forming a gate electrode on the substrate;
    forming a drain electrode and source electrode on the substrate;
    forming an organic semiconductor layer over at least a portion of the gate electrode, drain electrode, and source electrode to thereby form a Schottky junction with the gate electrode and an ohmic contact between:
    the organic semiconductor and the drain electrode; and
    the organic semiconductor and the source electrode.

17. The method of claim 16 wherein at least one of forming a gate electrode, forming a drain and source electrode, and forming an organic semiconductor layer includes printing.

18. The method of claim 17 wherein printing comprises non-contact printing.

19. The method of claim 18 wherein non-contact printing includes at least one of ink jet, electrostatic, laser transfer, and micro-dispensing.

20. The method of claim 17 wherein printing comprises contact printing.

21. The method of claim 20 wherein contact printing includes at least one of stamping, screen printing, flexographic, and micro-contact printing.

22. The method of claim 17 wherein printing comprises contact and non-contact printing.

23. The method of claim 17 wherein each of the gate electrode, drain electrode, source electrode, and organic semiconductor layer are formed by printing.

24. The method of claim 16 wherein providing a substrate includes providing a flexible substrate.

25. The method of claim 16 wherein providing a substrate includes providing a substantially rigid substrate.

* * * * *